(12) United States Patent
Agarwal et al.

(10) Patent No.: US 8,154,309 B2
(45) Date of Patent: Apr. 10, 2012

(54) CONFIGURABLE PSRO STRUCTURE FOR MEASURING FREQUENCY DEPENDENT CAPACITIVE LOADS

(75) Inventors: Kanak B. Agarwal, Austin, TX (US); Jerry D. Hayes, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 12/489,656

(22) Filed: Jun. 23, 2009

(65) Prior Publication Data

US 2010/0321042 A1 Dec. 23, 2010

(51) Int. Cl.
G01R 27/26 (2006.01)
(52) U.S. Cl. ........ 324/681; 324/682; 324/677; 324/658; 331/36 C; 331/44; 331/64; 331/57; 331/1 A; 331/74; 331/135
(58) Field of Classification Search .......... 324/681, 324/682, 677, 658; 331/36 C, 44, 64, 57, 331/1 A, 74, 135
See application file for complete search history.

(56) References Cited

U.S. PATENT DOCUMENTS

| | | | |
|---|---|---|---|
| 4,795,964 A * | 1/1989 | Mahant-Shetti et al. | 324/681 |
| 6,333,680 B1 * | 12/2001 | Smith et al. | 331/57 |
| 6,774,644 B2 * | 8/2004 | Eberlein | 324/682 |
| 6,934,671 B2 | 8/2005 | Bertsch et al. | |
| 7,071,710 B2 | 7/2006 | Marshall et al. | |
| 7,205,854 B2 * | 4/2007 | Liu | 331/57 |
| 7,230,435 B2 * | 6/2007 | Kunikiyo et al. | 324/658 |
| 7,265,639 B2 * | 9/2007 | Bhushan et al. | 331/57 |
| 7,279,995 B2 * | 10/2007 | Kernahan et al. | 331/57 |
| 7,475,366 B2 | 1/2009 | Kuemerle et al. | |
| 7,486,086 B2 * | 2/2009 | Chang et al. | 324/658 |
| 7,495,519 B2 * | 2/2009 | Kim et al. | 331/44 |
| 2006/0055417 A1 * | 3/2006 | Lee | 324/681 |
| 2008/0270954 A1 | 10/2008 | Habib et al. | |
| 2009/0002012 A1 | 1/2009 | Doong et al. | |
| 2009/0015340 A1 * | 1/2009 | Dally et al. | 331/57 |
| 2009/0083690 A1 | 3/2009 | Habib et al. | |
| 2010/0253382 A1 * | 10/2010 | Wang et al. | 324/771 |
| 2011/0057736 A1 * | 3/2011 | Badillo | 331/57 |

OTHER PUBLICATIONS

Kim et al., "65 nm SOI CMOS SoC Technology for Low-Power mmWave and RF Platform", IEEE Topical Meeting on SiRF 2008, pp. 46-49.*

Anonymous, Method for measuring interconnect parasitics, Oct. 13, 2006, IPCOM000141790D.

* cited by examiner

Primary Examiner — Huy Q Phan
Assistant Examiner — Lamarr Brown
(74) Attorney, Agent, or Firm — Libby Z. Toub

(57) ABSTRACT

A configurable PSRO measurement circuit is used to measure the frequency dependent capacitance of a target through silicon via (TSV) or other conductive structure. Measurements of the target structure are aided by using adjustable resistors and a de-embedding structure to measure the effects of parasitic capacitance, $C_{PAR}$. Current is measured to both the device under test (DUT) and the de-embedding structure. From these measurements, the frequency dependent capacitance of the DUT is calculated.

14 Claims, 8 Drawing Sheets

| Description | sel0 | sel1 | sel2 | Signal |
|---|---|---|---|---|
| Average Capacitance | High | X | X | m1 |
| Single Capacitance (selected DUT) | Low | High | Low | m2 |
| Single Capacitance (unselected DUT) | Low | Low | Low | m3 |
| Single Resistance (unselected DUT) | Low | High | High | m4 |
| Single Resistance (unselected DUT) | Low | Low | High | m5 |

Reference

Average Capacitance
(PSRO configuration)

Single
Capacitance
(Selected DUT)

Single Capacitance
(Unselected DUTs)

Single Resistance
(Selected DUT)

Single Resistance
(Unselected DUTs)

CONFIGURABLE PSRO STRUCTURE FOR MEASURING FREQUENCY DEPENDENT CAPACITIVE LOADS

FIELD OF THE INVENTION

The present invention relates generally to techniques of parametric measurements in an integrated circuit, and more particularly, to on-chip test structures, and corresponding methods of measuring contact and via parasitic capacitance in a semiconductor device.

BACKGROUND

As the density of integrated circuits increases, device feature sizes shrink down to the ultra-deep submicron range (less than 0.25 micron). At this point, interconnect delays (or "net delays") between devices due to parasitic resistance and capacitance from conductive paths in the circuit begin to dominate the overall time delay in an integrated circuit (IC). Contact and via capacitance accounts for a significantly increased proportion of the total interconnect delay in ICs made with advanced technology, due to the reduced contact-to-gate-electrode spacing and increased contact and via density. In particular, through silicon vias (TSV) are conductive structures that carry signals vertically between horizontal layers of the silicon chip. TSVs have a capacitance that varies significantly with frequency, due mainly to TSV-bulk silicon interaction. Currently, the parasitic capacitance associated with the contacts and TSVs is difficult to measure.

Traditionally, bench tests are performed to measure the frequency dependent capacitance. However, such techniques suffer from limited throughput and require special testing equipment. For example, capacitive load comb structures are used to measure coupling capacitance, but these tests are difficult to perform on in-line testers and do not extend to determine frequency dependence. Another technique is to measure loaded and unloaded PSROs (performance scan-ring oscillator), and develop frequency dependence estimates from the measured differences. Similarly, this technique has many sources of error and requires multiple loaded PSROs of varying lengths to understand frequency dependency. A third existing technique is to use charge-based cross talk techniques to isolate and measure individual DUT (device under test) capacitances or first and second moments of parametric distribution. In practice, array switching frequencies of greater than 1 GHz are difficult to achieve, limiting the ability of this technique to extract useful information at high frequencies. The traditional techniques are therefore not suitable for use with in-line tests for frequency dependent capacitance measurements.

New test structures are needed that can extract measurements of TSV capacitance as a function of frequency, providing an understanding of semiconductor device performance at high frequencies.

SUMMARY OF THE INVENTION

A circuit is provided for use in measuring the frequency dependent capacitance of a signal transmission structure on an integrated circuit device, especially for measuring a TSV structure but also possibly other structures. The circuit includes a number of PSRO (performance scan-ring oscillator) stages each having an input selection stage circuit, a signal delay circuit, and a driver stage circuit. The driver stage provides current to two loads, one containing the capacitance to be measured, and the other containing a de-embedding circuit used to account for parasitic capacitance in the measurement.

The signal delay circuit preferably includes a PFET control terminal and an NFET control terminal, and at least one delay element, the signal delay circuit operable for applying the signal to the PFET and NFET control terminals such that they are not high at the same time. The drivers are controlled by the NFET and PFET control terminals. The output of the first driver connected in parallel to a first variable resistor and to a PSRO stage output terminal, the first variable resistor connected in series to a first measured capacitance, the first measured capacitance including a first parasitic capacitance portion and a second target capacitance portion. The output of the second driver connected to a second variable resistor, the second variable resistor connected in series to a second measured capacitance, the second measured capacitance including a parasitic capacitance portion.

The PSRO stages are connected in series with their PSRO stage output terminal connected to the first input terminals of a subsequent PSRO stage circuit in the series. An enable signal is preferably connected the first input terminal of a first PSRO stage. An oscillating control signal connected to the second input terminal of each PSRO stage. Current measurement circuitry is included operable to measure the current in the first and second drivers of each PSRO stage. The PSRO stages may also be configured in an average measurement mode to measure average capacitances of multiple DUTs, one on each PSRO stage.

In some embodiments, delay elements in the delay circuit are made up of a first delay element connecting the delay circuit input to the PFET control terminal and in parallel to the input of a second delay element, the second delay element output coupled to the NFET control terminal. The second delay element may connect to a first input of an AND gate, a second input of the AND gate may connect to the delay circuit input, and the output of the AND gate connects to the NFET control terminal. Various pass gates in the PSRO stage operable to configure the PSRO stage in different modes. Each PSRO stage is preferably adapted to be operated independently to measure capacitance values of respective transmission structures associated with each stage.

Various embodiments also include methods for constructing or using circuits according to the principles herein. One preferred method measures the frequency dependent capacitance of a signal transmission structure on an integrated circuit device. The method provides first and second oscillating current signals to first and second resistors, respectively, in a selected PSRO (performance scan-ring oscillator) stage circuit. Then, the frequency of the oscillating signals is increased until a maximum current is achieved while insuring full rail to rail transitions a first node of the first variable resistor. At such a point, the method then measures the current of the first and second oscillating current signals. This is used to calculate a capacitance value of a portion of the load supplied by the first oscillating current signal using the equation $C_{TSV} = (IV1 - IV2)/(f_{OUTPUT} * V1)$, where $C_{TSV}$ is the frequency dependent capacitance of a through-silicon via present as a load the first oscillating current signal, IV1 is the current supplied with the first oscillating current signal, IV2 is the current supplied with the second oscillating current signal, V1 is a supply voltage of the first oscillating current signal, and $f_{OUTPUT}$ is the highest frequency achieved providing full rail to rail transitions.

Preferably, the first and second resistors are variable resistors, and the method further comprises configuring first and second resistors with a selected set of resistor values, and repeating the measurement steps with multiple selected sets of resistor values for the first and second resistors. The repeated steps are preferably used to measure the capacitance of multiple through-silicon vias associated with additional PSRO stages.

DETAILED DESCRIPTION OF PREFERRED EMBODIMENTS

A preferred technique is to use existing charge-based cross talk techniques to obtain low frequency DUT capacitance statistics, but to use a new PSRO in-line capacitance measurement structure to obtain capacitance measurements as a function of frequency.

Figure 1A:
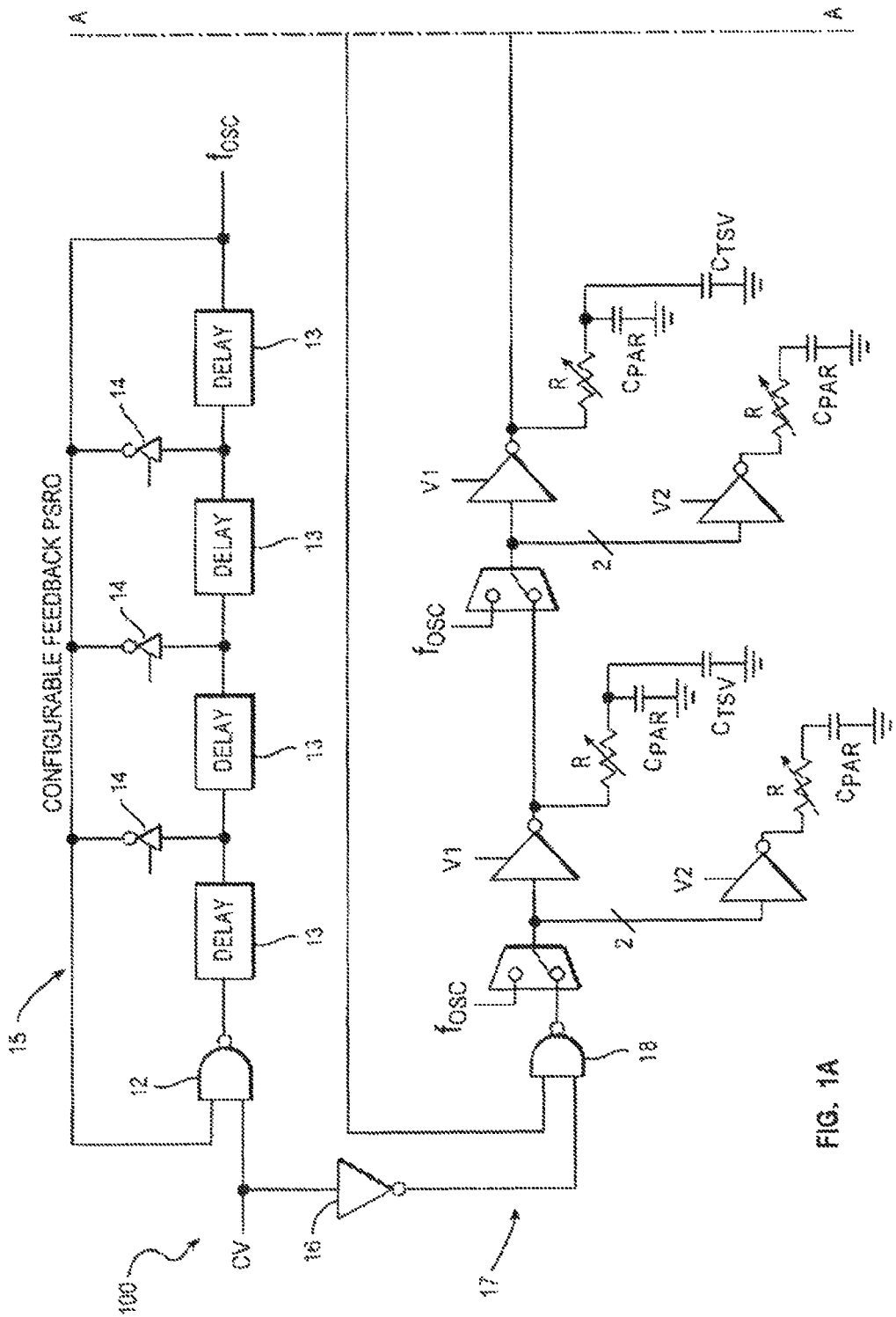
FIG. 1 shows a high-level circuit diagram of a configurable PSRO measurement circuit according to one embodiment.
Figure 1B:
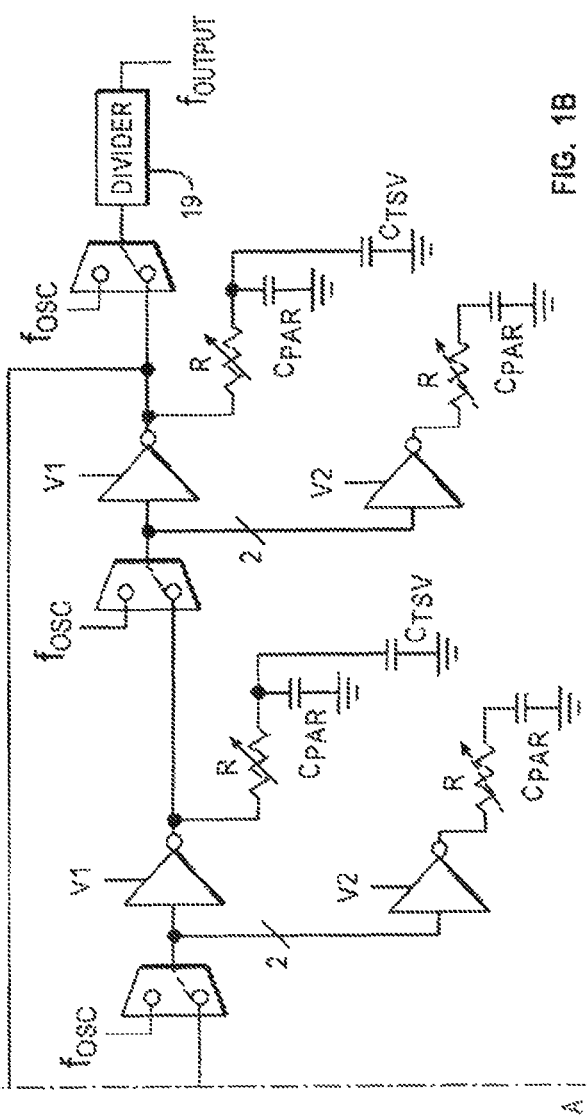

FIG. 1 shows a high-level circuit diagram of a configurable PSRO measurement circuit according to one embodiment. The depicted circuit is used to measure the frequency dependent capacitance of a target through silicon via (TSV) or other conductive structure, the target structure connected in the circuit at location $C_{TSV}$. Measurements of the target structure are aided by using adjustable resistor R1 and by using a de-embedding structure to measure the effects of parasitic capacitance, $C_{PAR}$. In the depicted PSRO circuit 100 has two regions, the upper region being a feedback logic circuit 15 which provides an oscillating signal $f_{OSC}$. This is generated using delay elements 13 and connected in series and interspersed with feedback connections including tri-state inverters 14. The feedback circuit 15 is activated through NAND gate 12 receiving an enable signal CV. This NAND function will provide a logical high into the configurable PSRO circuit 17 when the negated enable signal CV is low, and the feedback output signal is low.

The enable signal CV is also inverted and carried to the configurable PSRO circuit 17 depicted in the lower portion of the circuit diagram. PSRO circuit 17 is fed through NAND gate 18, combining a feedback of the PSRO circuit output and the inverted enable signal CV. PSRO circuit 17 includes a number of stages which are configurable to be used individually or in a group to measure capacitance. When used individually, the stages are driven by signal $f_{OSC}$, and when used collectively to measure average capacitances, they are driven by the output of the preceding stage. The configurable PSRO circuit 17, in a preferred embodiment, is used to measure respective signal transmission paths, which in the preferred embodiment are TSVs but may be other types of conductive or semiconductive signal paths such as contacts, traces, poly traces, or other connective structures or combinations thereof. That is, the circuits used herein may be used to measure frequency dependent capacitance of various types of conductive circuits, but are preferably used to measure TSV capacitance. The target capacitances to be measured are shown as $C_{TSV}$, each $C_{TSV}$ symbol representing a TSV to be measured. In preferred versions, the measured TSV are in circuits positioned in regions of the semiconductor device where the designer wishes to measure associated capacitances. The $C_{PAR}$ symbols represent parasitic capacitances of circuits surrounding the TSV. Average capacitance are measured when signal CV is low, and individual capacitances are measured when signal CV is high. A frequency divider 19 is connected to the output of the configurable PSRO circuit 17 to provide a scaled frequency signal $f_{OUTPUT}$.

Figure 2:
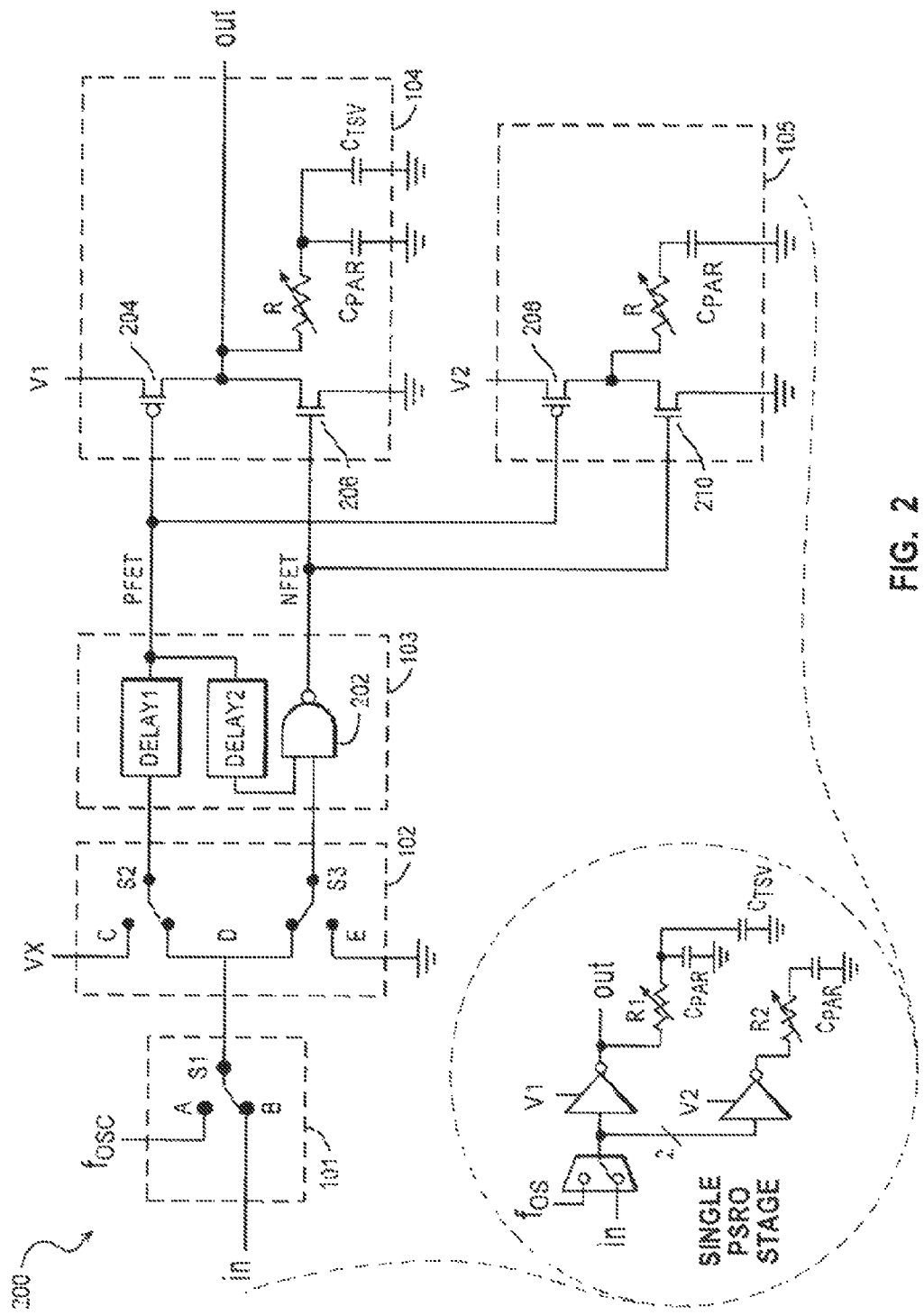
FIG. 2 shows a two-part circuit diagram for a single PSRO stage.

FIG. 2 shows a two circuit diagrams for a single PSRO stage. A stage 200 is shown enclosed in dotted lines, accompanied by a more detailed circuit diagram of the same circuit. The measurement process adjusts the variable resistors R1 and R2, and then operates the PSRO circuit to measure the capacitance of $C_{TSV}$, as is further described below.

The detailed circuit of PSRO stage 200 is divided into blocks 101-105 for easier reference. Block 101 is used to configure the stage for average capacitance or single capacitance measurements. For average capacitance measurements, switch S1 of block 101 is in position B that allows the input (in) that represents the signal from the previous stage to transfer to node D in block 102. Switches S2 and S3 of block 102 are each connected to node D allowing signal in to be applied to both inputs of block 103. Block 103 is used to create non-overlapping gate control signals to the NFET and PFET devices of block 104 (devices 204 and 206) and block 105 (devices 208 and 210) in order to eliminate crossbar (shoot through) current and ensure the current delivered by block 104 voltage supply V1 is used to charge $C_{TSV}$ and $C_{PAR}$ exclusively. Block 103 includes two delay elements, marked by their respective delay times DELAY1 and DELAY2. The output of DELAY1 is the PFET control signal, which also connects to the input of DELAY2. The output of DELAY2 passes through AND gate 202 where it is ANDed with the incoming signal from S3. The PFET and NFET control signals may also be passed through buffers before connecting to the gates of their respective transistors.

Block 104 (which may be referred to as an "output stage") includes a first driver having FET transistors 204 and 206, and the circuit node driven by the first driver from supply voltage V1. Attached to the first driver output is variable resistor R1, which connects to the DUT, in this case a capacitance $C_{TSV}$ to be measured, and to a parasitic capacitance $C_{PAR}$ representing a TSV to be compensated for in the measurement. Block 105 includes a second driver including FET transistors 208 and 210, supplied with supply voltage V2, which is preferably set equal to V1 but isolated from V1. Attached to the second driver output is variable resistor R2, which connects to a parasitic capacitance $C_{PAR}$ representing the parasitic capacitance to be compensated for in the measurement. The capacitance $C_{PAR}$ is built into the de-embedding structure by constructing an exact replica of the output stage (block 104), but without including a TSV structure. Other embodiments may use de-embedding stage 105 circuits that are an exact copy, but are known under the process employed to produce an equivalent parasitic capacitance to that in the output stage 104. It should also be noted that, in one preferred embodiment, the depicted transistors 204, 206, 208, and 210 are each implemented as two similar transistors in series, with their gates connected in parallel.

Figure 3:
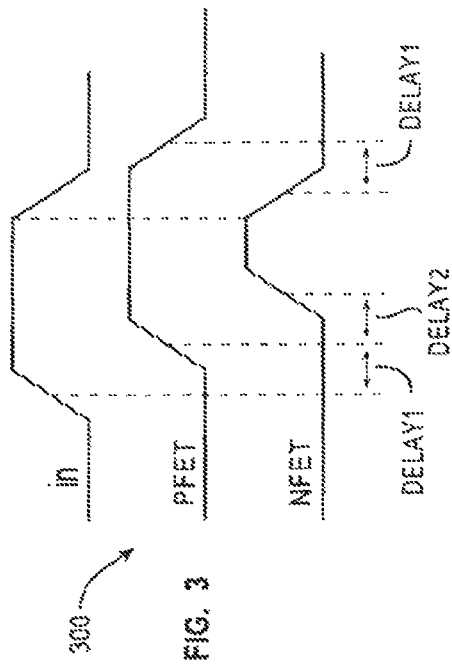
FIG. 3 shows a timing sequence to illustrate the FET control signals from FIG. 2.

Referring now to FIGS. 2 and 3, FIG. 3 shows a timing sequence to illustrate the FET control signals from FIG. 2. The depicted sequence begins with a low on signal in which turns on the PFET device (PFET signal is low) and turns off the NFET device (NFET signal is low). With a rising edge on signal in, the PFET signal will transition high after DELAY1 time, turning off the PFET device. With a rising edge on PFET, the NFET signal will transition high after DELAY2 time, turning on the NFET device. With a falling edge on in, the NFET signal immediately goes low turning off the NFET device. After DELAY1 time, the PFET signal goes low turning on the PFET device, thus completing the timing sequence. At no time during this sequence are the NFET and PFET devices simultaneously on thus eliminating crossbar current.

In FIG. 2, for single capacitance measurements of the PSRO stage containing the selected DUT as defined by the device scan chain, S1 of block 101 is connected to node A, transferring $f_{OSC}$ to node D. Switches S2 and S3 of block 102 are connected to node D applying $f_{OSC}$ to the inputs of block 103. The operation of block 103 in this mode is same as described for average measurements. For single capacitance measurements, the PSRO stages not containing the selected DUT are configured with switches S2 and S3 in block 102 are tied high and low respectively, turning off both PFET and NFET devices.

Figure 4:
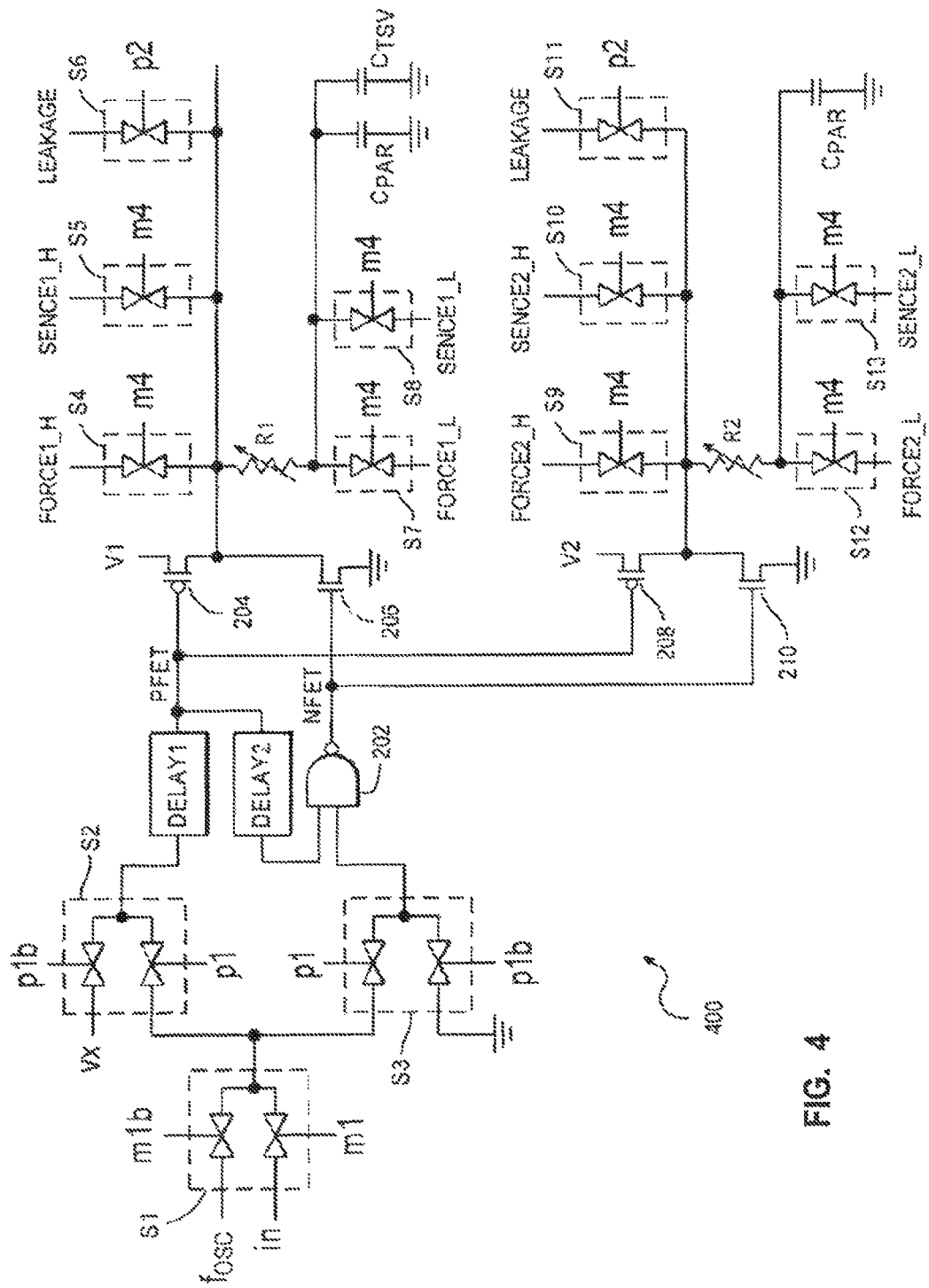
FIG. 4 shows a detailed circuit diagram with an implementation of a PSRO stage according to a preferred embodiment.

FIG. 4 shows a detailed circuit diagram with an implementation of a PSRO stage according to a preferred embodiment. The depicted PSRO stage circuit 400 includes switches S1, S2, and S3 shown implemented with pass gates in this embodiment. The logic signals controlling the various pass gates are also shown. Switch S1 is implemented with two pass gates controlled by signals m1 and m1b. In each case, a signal and its logical inverse are used to activate complimentary pairs of pass gates to implement each switch. That is signal m1b is an inverted version of signal m1, and signal p1b is an inverted version of signal p1.

Also depicted in FIG. 4 is a series of other switches (S4-S13) each implemented with a single pass gate in this embodiment. The control terminals of these pass gates are marked with the logic signals that control the gates. The combinatorial logic controlling these gates is described in more detail with respect to FIG. 5 and FIG. 6. Switches S4-S6 selectively connect various nodes to the output of the first driver. Switches S4 and S7 are operable to connect to Force1_H and Force1_L nodes, respectively. These nodes are supply voltages, preferably isolated, which are used to force the driver output node to a desired voltage for certain measurement modes. Switches S5 and S8 are operable to connect to Sense1_H and Sense1_L nodes, respectively, which are attached to voltage sensing circuits employed to measure the respective voltages when desired. Switch S6 is operable to connect the driver output node to a Leakage node, which is used for minimizing leakage currents in PSRO stage circuits that are not presently being used for measurements. As is further described below with respect to FIG. 7F, the Leakage node is connected to the V1 voltage for minimizing leakage across PFET 204.

Figures 5, 6:
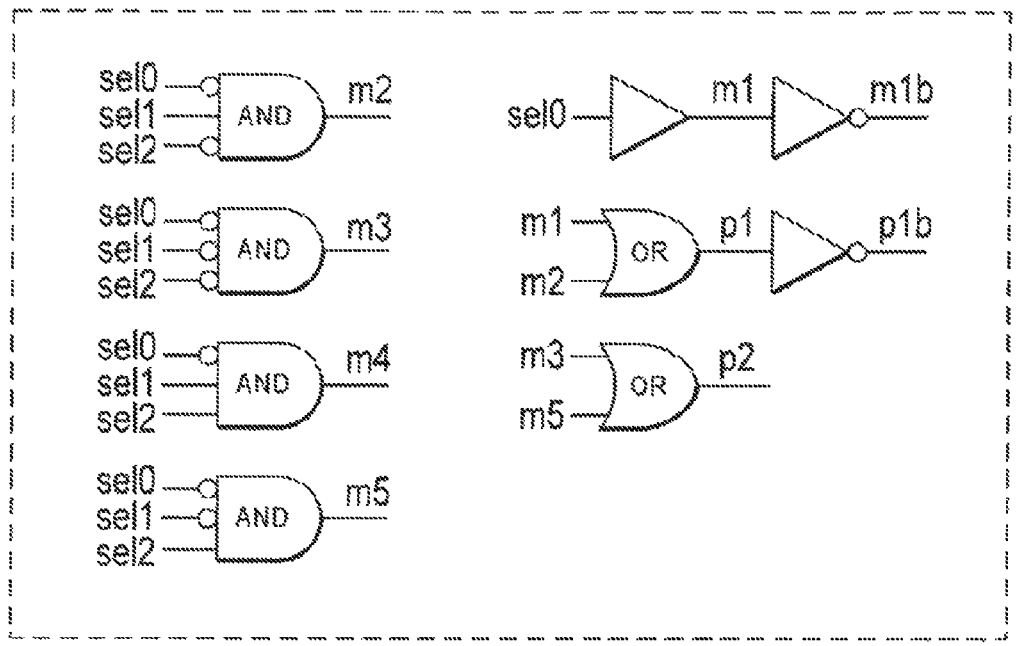
FIG. 5 shows logical combinations for various control signals in one embodiment.
FIG. 6 is a configuration table showing what digital control input values configure the PSRO circuit into various states.

FIG. 5 shows logical combinations for various control signals in one embodiment. The circuit is controlled by four digital control inputs, sel0-sel2. The control signals m1, m1b, p1, p1b, and p2 are produced using the depicted logic combinations.

Figure 7A:
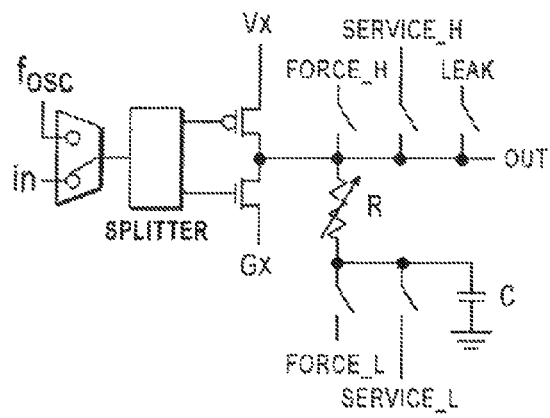
FIGS. 7A-7F show high-level circuit diagrams of a PSRO circuit controlled with the switches configured according to the various combinations listed in the FIG. 6 table.
Figure 7B:
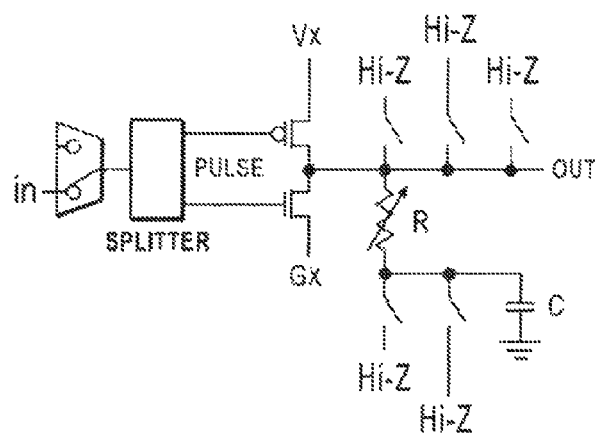
Figure 7C:
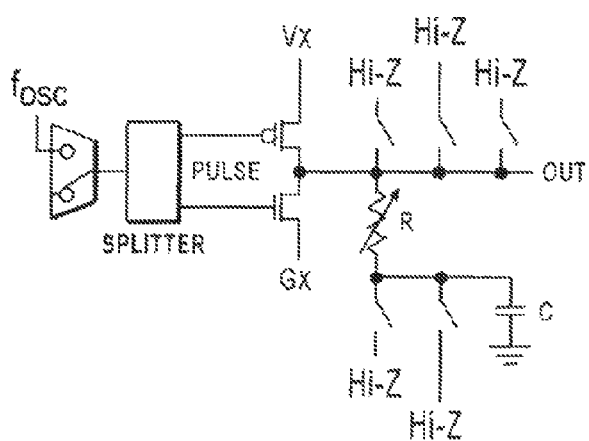
Figure 7D:
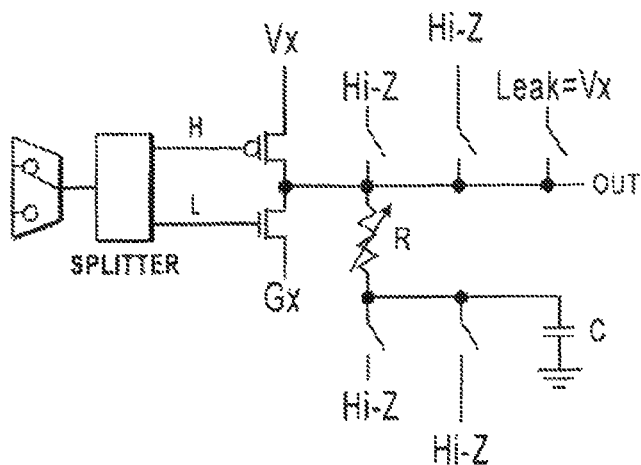
Figure 7E:
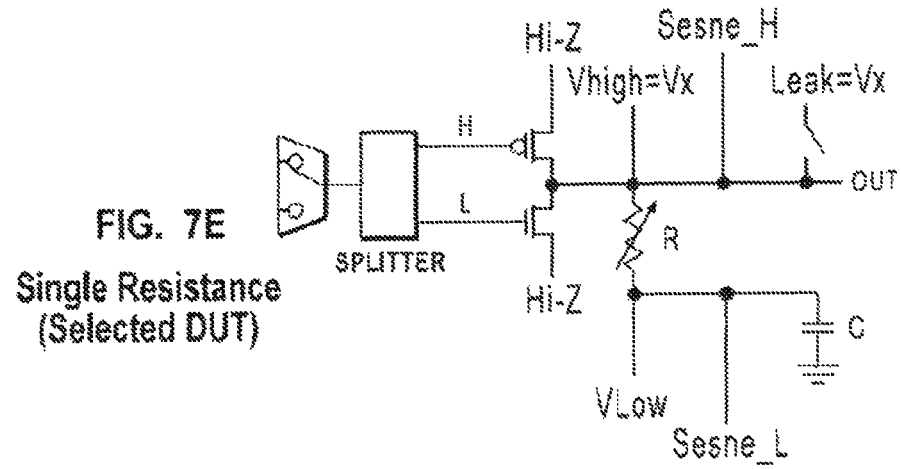
Figure 7F:
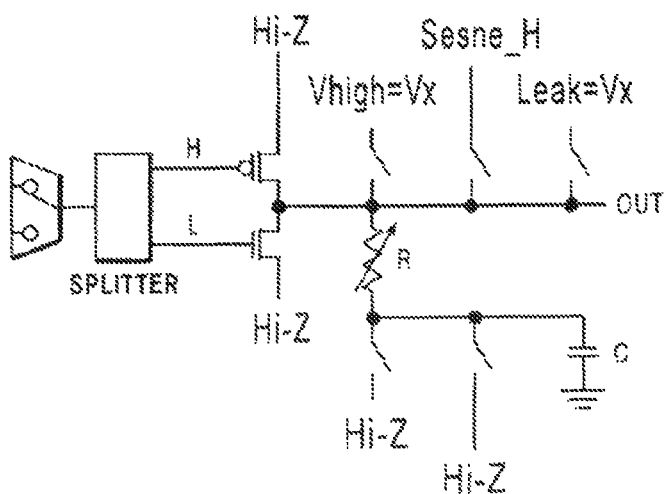

FIG. 6 is a configuration table showing what digital control input values configure the PSRO circuit into various states. FIGS. 7A-7F show high-level circuit diagrams of a PSRO circuit controlled with the switches configured according to the various combinations listed in the FIG. 6 table. Notice that each branch of the PSRO stage circuit (the de-embedding branch with the second driver, or the DUT branch with the first driver) is configured similarly when using that stage. That is, in FIGS. 7A-7F, the resistor R represents R1 or R2. FIG. 7A shows a Reference configuration that depicts all of the incoming signals included for reference to the other FIGS. 7B-7F. FIG. 7B shows an Average Capacitance configuration of a PSRO stage, which is activated for all stages in the PSRO circuit (for example, the four stages shown in FIG. 1) when measuring average values for all of the connected DUTs. FIG. 7C shows a Single Capacitance measurement configuration used for measuring the capacitance of a single selected DUT. FIG. 7D shows a Single Capacitance configuration used on un-selected DUTs when taking measurements on selected DUTs as in FIG. 7C. For example, if the first PSRO stage in FIG. 1 is selected, it will be configured as in FIG. 7C, while the other three stages would be configured as in FIG. 7D. Any single stage may be selected. FIG. 7E shows a Single Resistance configuration for measuring the resistance of a single selected DUT, the configuration used for the stage containing the selected DUT, and FIG. 7F contains the Single Resistance configuration that is preferably used for all of the un-selected stages for taking single resistance measurements of a selected stage.

Figure 8:
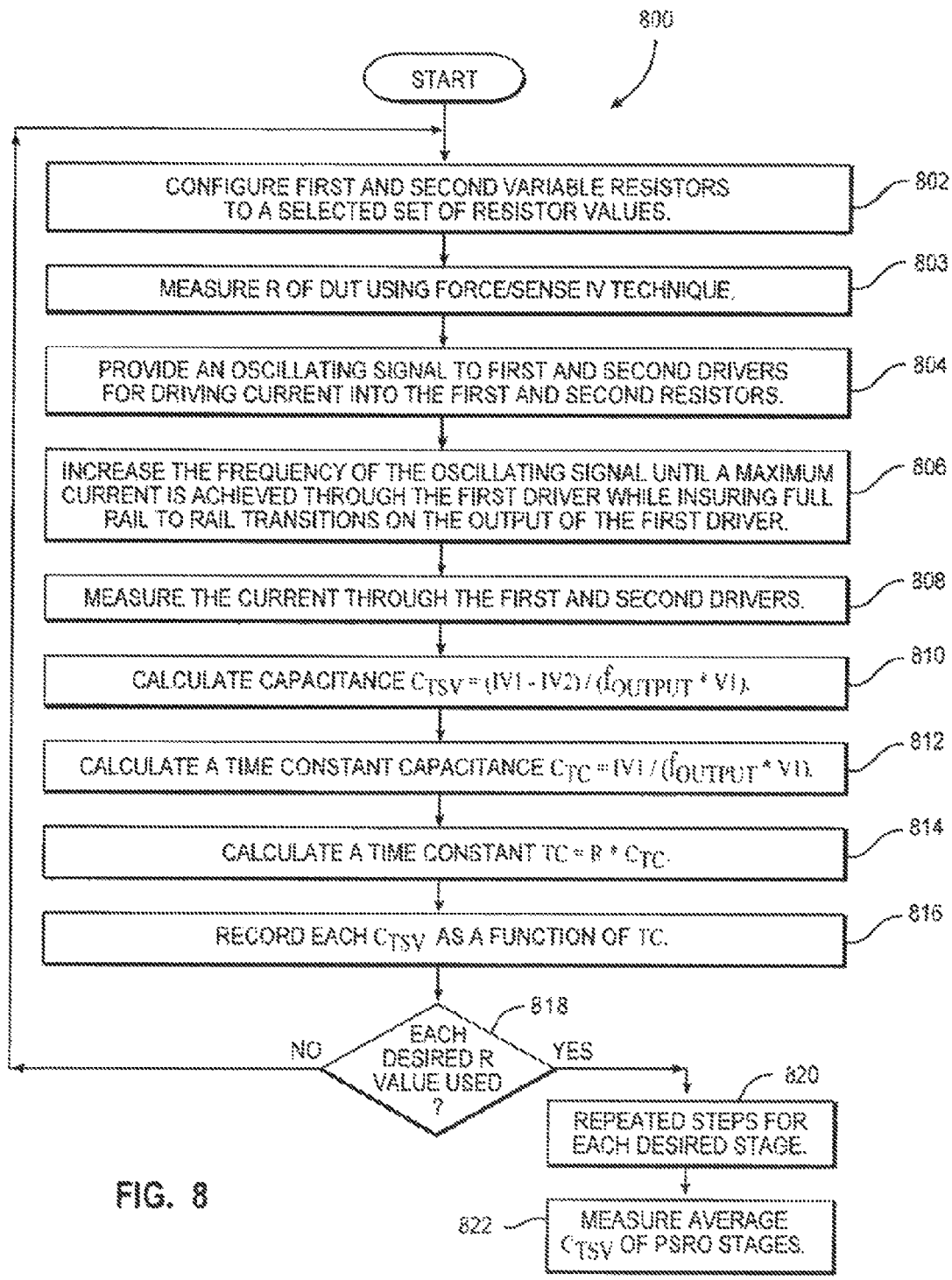
FIG. 8 is a flow chart of a process for measuring frequency dependent capacitance, which may be carried out with the circuits described herein.

FIG. 8 is a flow chart of a process for measuring frequency dependent capacitance, which may be carried out with the circuits described herein. The depicted process 800 for measuring the frequency dependent capacitance $C_{TSV}$ of a signal transmission structure begins with block 802, which configures first and second variable resistors (R1 and R2) in a first PSRO stage to a selected set of resistor values. At block 803, the process measures the resistance of the conductive structure under test using a force/sense technique, preferably forcing a desired current and measuring the resulting voltage. Next at block 804, the process provides an oscillating signal to first and second drivers (comprised of FETs 204, 206 and FETs 208, 210, for example) for driving current into the first and second resistors in the PSRO stage, and increases (block 806) the frequency of the oscillating signal until a maximum current is achieved through the first driver while insuring full rail to rail transitions on the output of the first driver. It is understood that "full rail to rail transitions" means that the voltage swing is within predefined limits appropriate for the particular circuit under test. At the highest frequency point before rail-to-rail limits are exceeded, the process measures the current through the first and second drivers (block 808). With the measured current, the process at block 810 calculates a capacitance value of a load driven by the first driver, preferably using the equation $C_{TSV}=(IV1-IV2)/(f_{OUTPUT}*V1)$, where $C_{TSV}$ is the frequency dependent capacitance of a through-silicon via present as a load on the first driver output, IV1 is the current through the first driver, IV2 is the current through the second driver, V1 is a supply voltage of the first driver, and $f_{OUTPUT}$ is the highest frequency achieved with rail to rail transitions. The process may also include calculating a time constant capacitance $C_{TC}=IV1/(f_{OUTPUT}*V1)$ at block 812. From this value, the process may calculate a time constant TC=R*$C_{TC}$, where R is the value of the resistor driven by the first driver, at block 814. The process then records each $C_{TSV}$ as a function of TC at block 816. This process may be repeated for a single PSRO stage using different values for the variable resistors R1 and R2 until all desired measurements have been taken.

At block 818, the process will repeat the steps until all desired resistor values have been used. Preferably, the resistor values are configured using an initial estimate of the target DUT capacitance might be, from known process variations.

The range of possible capacitances will each have an associated slew rate for a known resistance. Resistor values are chosen to characterize the circuit across the possible range of slew rates. For example, in one process employed at the time of filing this application, possible capacitance values for $C_{TSV}+C_{TSV}$ (the capacitive load on the output stage driver circuit) may range from 10 to 80 fempto-farads. Variable resistor values are chosen to create a desired range of slew rates assuming the capacitance is somewhere in the target range (but as yet the exact capacitance is unknown). For example, at the time of filing a 10 pico-second slew rate is considered a fast slew rate, while a 1 nano-second slew rate is considered slow. The resistance values may be chosen to provide such slew rates at the highest and lowest expected capacitance values. In one simplified embodiment, the variable resistor may be implemented as simple pass gate structure or other structure providing only two possible resistor values, constructed to provide high and low slew rates. Other embodiments may use a variable resistor with high granularity to take more measurements in the range. Similar steps are then repeated with each PSRO stage for which measurements are required. The process then measures the average $C_{TSV}$ over a number of PSRO stages, as indicated at block 822. Preferably this step measures the average across all PSRO stages connected together in a circuit. Other embodiments may average across less than all stages.

As used herein, the terms "comprising," "including," "having," and the like are to be understood to be open-ended, that is, to mean including but not limited to.

The above described preferred embodiments are intended to illustrate the principles of the invention, but not to limit the scope of the invention. Various other embodiments and modifications to these preferred embodiments may be made by those skilled in the art without departing from the scope of the present invention.

The invention claimed is:

1. A circuit for use in measuring a frequency dependent capacitance of a signal transmission structure on an integrated circuit device, the circuit comprising:
   (a) a number of PSRO (performance scan-ring oscillator) stages each including:
      (i) an input stage circuit including two input terminals and a switch for selectively coupling a signal from one of the two input terminals to an input terminal of a signal delay circuit;
      (ii) the signal delay circuit including a PFET control terminal and an NFET control terminal, and at least one delay element, the signal delay circuit operable for applying the signal to the PFET and NFET control terminals such that they are not on at the same time;
      (iii) a driver stage circuit including first and second drivers each having an output and PFET and NFET transistors, the PFET control terminal connected to control the PFET transistors of both drivers, and the NFET control terminal connected to control the NFET transistors of both drivers;
      (iv) the output of the first driver connected in parallel to a first variable resistor and to a PSRO stage output terminal, the first variable resistor connected in series to a first measured capacitance, the first measured capacitance including a first parasitic capacitance portion and a second target capacitance portion; and
      (v) the output of the second driver connected to a second variable resistor, the second variable resistor connected in series to a second measured capacitance, the second measured capacitance including a parasitic capacitance portion;
   (b) the number of PSRO stages connected in series with their PSRO stage output terminal connected to the first input terminals of a subsequent PSRO stage circuit in the series;
   (c) an enable signal connected the first input terminal of a first PSRO stage;
   (d) an oscillating control signal connected to a second input terminal of each PSRO stage; and
   (e) current measurement circuitry operable to measure the current in the first and second drivers of each PSRO stage.

2. The circuit of claim 1 wherein the at least one delay element in the signal delay circuit comprises a first delay element connecting the delay circuit input to the PFET control terminal and in parallel to an input of a second delay element, the second delay element output coupled to the NFET control terminal.

3. The circuit of claim 2 in which the second delay element connects to a first input of an AND gate, a second input of the AND gate connects to the delay circuit input, and the output of the AND gate connects to the NFET control terminal.

4. The circuit of claim 3 further comprising four pass gates in the PSRO stage operable to configure the PSRO stage in different modes.

5. The circuit of claim 1 in which each PSRO stage is adapted to be operated independently to measure capacitance values of respective transmission structures associated with each stage.

6. A method of measuring a frequency dependent capacitance of a signal transmission structure on an integrated circuit device, the method comprising:
   (a) configuring first and second variable resistors in a first PSRO (performance scan-ring oscillator) stage to a selected set of resistor values;
   (b) providing an oscillating signal to first and second drivers for driving current into the first and second resistors in the first PSRO stage, and increasing the frequency of the oscillating signal until a maximum current is achieved through the first driver while insuring full rail to rail transitions on the output of the first driver;
   (c) at the point determined in step (b), measuring the current through the first and second drivers;
   (d) calculating a capacitance value of a portion of the load driven by the first driver using the equation $C_{TSV}=(IV1-IV2)/(f_{OUTPUT}*V1)$, where $C_{TSV}$ is the frequency dependent capacitance of a through-silicon via present as a load on the first driver output, IV1 is the current through the first driver, IV2 is the current through the second driver, V1 is a supply voltage of the first driver, and $f_{OUTPUT}$ is the highest frequency achieved at step (b); and
   (e) repeating steps (a)-(d) with different selected sets of resistor values for the first and second variable resistors.

7. The method of claim 6 in which the repeated steps further include calculating a time constant capacitance $C_{TC}=IV1/(f_{OUTPUT}*V1)$.

8. The method of claim 7 in which the repeated steps further include calculating a time constant $TC=R*C_{TC}$, where R is the value of the resistor driven by the first driver.

9. The method of claim 8 in which the repeated steps further include recording each $C_{TSV}$ as a function of TC.

10. The method of claim 9 in which the repeated steps further include measuring average $C_{TSV}$ in a number of PSRO stages including the first PSRO stage.

11. The method of claim 6 in which the repeated steps further include measuring a capacitance of multiple through-silicon vias associated with additional PSRO stages.

12. A method of measuring a frequency dependent capacitance of a signal transmission structure on an integrated circuit device, the method comprising:
(a) providing first and second oscillating current signals to first and second variable resistors, respectively, in a selected PSRO (performance scan-ring oscillator) stage circuit and increasing the frequency of the oscillating signals until a maximum current is achieved while insuring full rail to rail transitions a first node of the first variable resistor;
(b) at the point determined in step (a), measuring the current of the first and second oscillating current signals; and
(c) calculating a capacitance value of a portion of a load supplied by the first oscillating current signal using the equation $C_{TSV}=(IV1-IV2)/(f_{OUTPUT}*V1)$, where $C_{TSV}$ is the frequency dependent capacitance of a through-silicon via present as a load the first oscillating current signal, IV1 is the current supplied with the first oscillating current signal, IV2 is the current supplied with the second oscillating current signal, V1 is a supply voltage of the first oscillating current signal, and $f_{OUTPUT}$ is the highest frequency achieved with full rail to rail transitions at step (a).

13. The method of claim 12, wherein the first and second resistors are variable resistors, and the method further comprises configuring first and second resistors with a selected set of resistor values, and repeating steps (a)-(c) with multiple selected sets of resistor values for the first and second resistors.

14. The method of claim 13 wherein the repeated steps further include measuring the capacitance of multiple through-silicon vias associated with additional PSRO stages.

* * * * *